United States Patent [19]

Liu et al.

[11] Patent Number: 5,008,208
[45] Date of Patent: Apr. 16, 1991

[54] METHOD OF MAKING PLANARIZED, SELF-ALIGNED BIPOLAR INTEGRATED CIRCUITS

[75] Inventors: Michael S. Liu, Bloomington; Huang-Joung Chen, Maple Grove, both of Minn.

[73] Assignee: Honeywell Inc., Minneapolis, Minn.

[21] Appl. No.: 281,195

[22] Filed: Dec. 7, 1988

[51] Int. Cl.$^5$ ............................................. H01L 21/70
[52] U.S. Cl. .................................... 437/31; 437/61; 437/67; 437/89; 437/99; 437/162; 437/191; 437/228; 437/233; 437/235; 357/59
[58] Field of Search ................. 437/31, 89, 99, 162, 437/46, 67, 191, 197, 228, 235; 351/595

[56] References Cited

U.S. PATENT DOCUMENTS

| | | | |
|---|---|---|---|
| 3,912,557 | 10/1975 | Hochberg | 437/162 |
| 3,971,059 | 7/1976 | Dunkley et al. | 437/31 |
| 4,151,006 | 4/1979 | De Graff et al. | 437/31 |
| 4,280,854 | 1/1981 | Shibata et al. | 437/31 |
| 4,283,733 | 8/1981 | Aomura | 357/59 H |
| 4,377,902 | 5/1983 | Shinada et al. | 437/99 |
| 4,400,865 | 8/1983 | Goth et al. | 437/67 |
| 4,445,268 | 5/1984 | Hinao | 437/31 |
| 4,462,847 | 7/1984 | Thompson et al. | 437/99 |
| 4,473,598 | 9/1984 | Ephrath et al. | 437/67 |
| 4,497,106 | 2/1985 | Momma et al. | 437/162 |
| 4,497,683 | 2/1985 | Celler et al. | 437/99 |
| 4,528,047 | 7/1985 | Beyer et al. | 437/67 |
| 4,569,123 | 2/1986 | Ishii et al. | 357/59 H |
| 4,666,556 | 5/1987 | Fulton et al. | 437/67 |
| 4,666,557 | 5/1987 | Collins et al. | 437/67 |
| 4,671,851 | 6/1987 | Beyer | 156/645 |
| 4,758,528 | 1/1988 | Goth et al. | 437/228 |
| 4,839,302 | 6/1989 | Kameyama | 437/31 |

OTHER PUBLICATIONS

Ghandhi, "VLSI Fabrication Principles," John Wiley and Sons, 1983, pp. 542-548, 568-587.

Primary Examiner—Brian E. Hearn
Assistant Examiner—Tom Thomas
Attorney, Agent, or Firm—Gregory A. Bruns

[57] ABSTRACT

A method for making a bipolar integrated circuit structure in a semiconductor substrate. A layer of insulating material having an implantation opening is formed on the upper surface of the semiconductor substrate. A polysilicon layer is formed in the implantation opening. A doping material is implanted into the polysilicon-filled opening. The doping material is diffused into the substrate material from the polysilicon-filled opening.

17 Claims, 2 Drawing Sheets

METHOD OF MAKING PLANARIZED, SELF-ALIGNED BIPOLAR INTEGRATED CIRCUITS

FIELD OF THE INVENTION

This invention relates to methods for fabricating bipolar integrated circuits having substantially planarized surfaces and self-aligned contacts.

BACKGROUND OF THE INVENTION

In forming bipolar integrated circuits, the goals include high yield, high reliability, small size, and low manufacturing costs. Existing methods of fabricating bipolar integrated circuits frequently involve steps which cause the upper surface of the circuit to be substantially non-planar. As a result, efforts at stacking integrated circuit components vertically result in a greater number of discontinuities and faults. Thus, it is desirable for stacking purposes to manufacture circuits having substantially planar upper surfaces. Such a feature would improve yield and reduce the cost of fabricating such circuits.

In making smaller circuits, the contacts for the circuit components, such as the base, collector, and emitter contacts of a transistor, become more difficult to accurately align. Limits on the tolerance of the alignment equipment make alignment difficult.

Existing methods of fabricating bipolar integrated circuits use a number of masking steps to define each region of the circuit element as well as the contact areas for each contact of the element. Each additional masking step creates a further opportunity for reducing yield and reliability and further increases the cost of fabricating the circuits.

Finally, it is desirable to fabricate bipolar transistors having relatively low collector-substrate junction capacitances, low collector, base, and emitter resistances, low emitter sidewall capacitances, and improved speed.

SUMMARY OF THE INVENTION

The present invention is a method of making a bipolar integrated circuit structure in a semiconductor substrate comprising the steps of forming an implantation opening in a layer of insulating material on the upper surface of the semiconductor substrate, forming a polysilicon layer in the opening formed in the insulating material layer, and implanting into the polysilicon-filled opening a doping material capable of diffusing into the substrate material below the polysilicon-filled opening.

DETAILED DESCRIPTION OF THE PREFERRED EMBODIMENT

A preferred method of making planarized, self-aligned bipolar integrated circuits in accordance with the present invention comprises the steps of forming a layer of insulating material on the upper surface of a semiconductor substrate material; forming at least one opening in said insulating material layer and semiconductor substrate using a suitable mask; forming a polysilicon layer in the opening formed in the insulating material layer, the polysilicon layer being formed by selective epitaxial growth; defining an implantation window for implanting a selected doping material in at least one of said openings formed in the insulating layer; and implanting the selected doping material into the polysilicon-filled implantation openings for diffusion into the substrate material.

More than one implantation window may be defined for implanting selected materials in additional openings formed in the insulating layer. In this manner, the n+ and p+ regions which form the base, emitter and collector regions of a bipolar transistor are formed using fixed implantation windows.

Further improvements in the method as described include dielectric isolation of the integrated circuit structure through the use of selective epitaxial growth of isolation regions in trenches bordering the circuit region. Additional variations and steps are described in further detail below.

As a result of the method described herein, a bipolar circuit having a substantially planarized upper surface may be formed. Such planarization will improve performance of the circuit, especially when vertical stacking of circuit components is used. The definition of the emitter, collector and base windows in the oxide with polysilicon selective epitaxial growth eliminates the need for alignment of these windows during n+ and p+ implanting or other steps in which alignment of these windows is critical. The number of masking steps is reduced, improving yield and reducing cost. In one embodiment, an additional step for implanting an n+ region at the emitter is eliminated, reducing cost and emitter sidewall capacitance. Moreover, the self-aligning feature of the emitter, collector and base windows allows the use of smaller circuits, improving speed and reducing cost. Further advantages of the present invention will be clear to one skilled in the art upon review of the following detailed description.

Fabrication of bipolar integrated circuits starts with a wafer having a doped substrate. The description herein is based on the use of a silicon wafer having a p doped substrate. The circuit described is an npn transistor. However, one skilled in the art will recognize that the process described herein may be adaptable to the fabrication of other circuit elements using various substrate and epitaxial materials.

Figure 1:
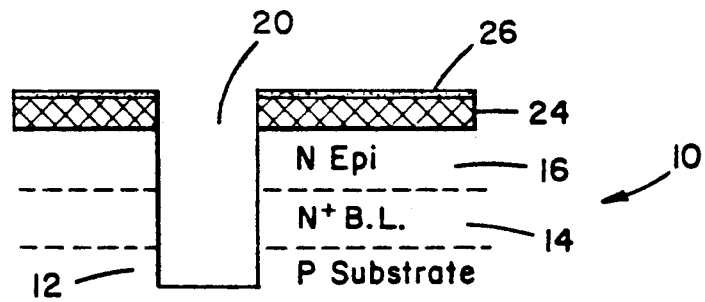
FIG. 1 is a cross-sectional view of a semiconductor substrate structure having a p doped substrate layer, an n+ doped buried layer, and an n doped epitaxial layer.

FIG. 1 shows semiconductor structure 10 having a p doped substrate 12. As is known in the art, the use of an n+ doped buried layer 14 as shown in FIG. 1 reduces collector series resistance. The n+ buried layer 14 may be formed with implantation, diffusion, or epitaxy prior to the growth of the n doped epitaxial layer 16. The n doped epitaxial layer 16 is shown in FIG. 1 as being grown on top of the n+ buried layer 14.

FIG. 1 also shows a groove or trench 20 formed in semiconductor substrate 10. The trench is typically formed around the region to be isolated by layering a masking material 24 across the n doped epitaxial layer 16 of substrate 10. Mask material 24 has a window which defines the boundaries of the groove. Typically, the masking layer will comprise successive layers of silicon dioxide ($SiO_2$) 24 and silicon nitride 26.

The groove typically is cut into the substrate material using an etching chemical. The thickness of the trench will typically be in the range of 3.5-5.0 microns. The various layers as shown in the figures are not to scale for purposes of clarity.

Once groove 20 is formed in the substrate material, an isolation layer such as an oxide layer 28 is formed on the inner walls and bottom of the trench. Silicon dioxide is also typically used for this layer. A typical thickness of the oxide layer inside the trench is approximately 1500 Angstroms.

Figure 2:
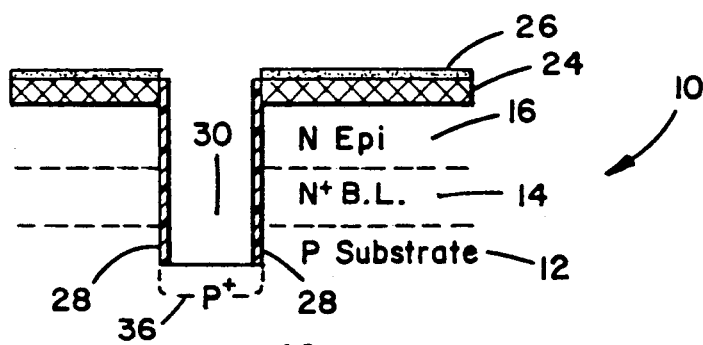
FIGS. 2 and 3 are cross-sectional views of a semiconductor substrate structure having a trench in which a polysilicon material is grown.

An etching process such as reactive ion etching is then applied to the trench to remove the oxide layer formed on the bottom surface of the groove, as shown in FIG. 2. The reactive ion etching process will reduce the thickness of the bottom layer of oxide to, for example, approximately 300 Angstroms. To prevent damage to the substrate material, the last portion of the oxide which is etched from the bottom of the groove is typically etched using a wet etch process such as an HF etch. This process leaves the oxide layer 28 on the side walls of the trench and a bottom surface 30 without an oxide layer, as shown in FIG. 2.

FIG. 2 also shows the semiconductor substrate implanted by a channel stop implant 36. As applied to an npn transistor, this channel stop implant is a p+ doped region immediately below the etched groove bottom wall 30. This channel stop implant improves the isolation characteristics of the circuit element, and reduces parasitic capacitance effects.

Figure 3:
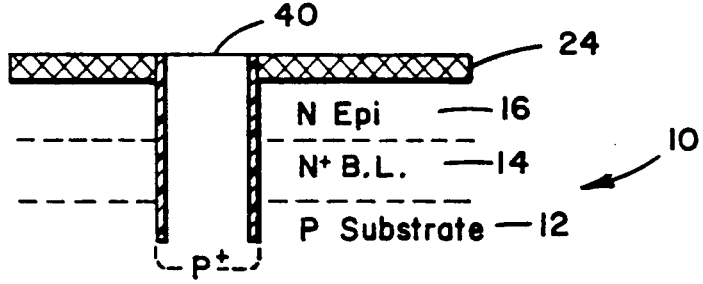

As shown in FIG. 3, the groove is refilled with a polysilicon material 40. A selective epitaxial growth process is used to refill the groove in order to improve the planarity of the upper surface of the semiconductor component. Planarization is completed when the nitride layer (26 in FIG. 2) is stripped from the semiconductor. FIG. 3 shows the substrate after the nitride layer is stripped.

The polysilicon 40 which is deposited in the groove or trench by selective epitaxy will typically be a p+ doped material. However, by use of this selective epitaxy process, this material may be either doped or undoped. By use of p+ doped polysilicon, the channel-stop implantation step can be eliminated.

Figure 4:
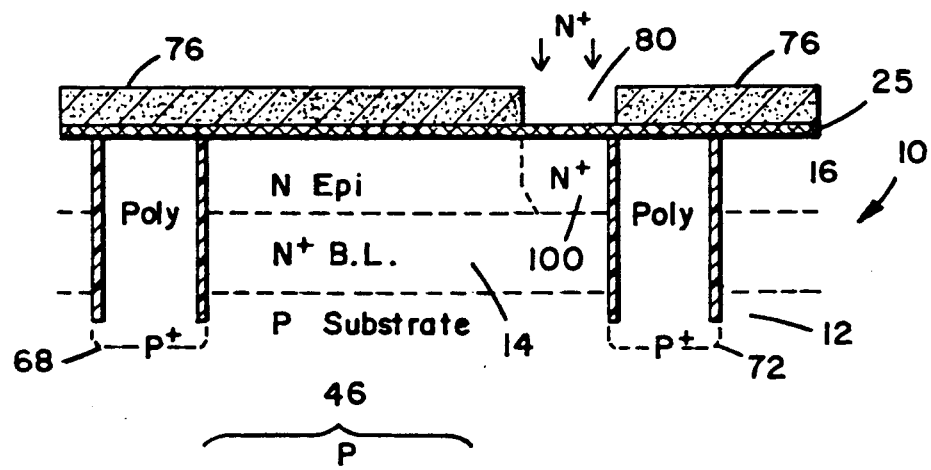
FIGS. 4 and 5 are cross-sectional views of process steps and the resulting structures in accordance with a preferred implementation of the present invention.

In further preferred processing steps, masking material layer 24 is removed, and a new oxide layer 25 is formed on the substrate, as shown in FIG. 4. FIG. 4 also shows the formation of a new masking layer 76 having a sinker region window 80 which defines n+ sinker region 100 separated from the p doped base region 90 of the substrate. Typically, the sinker region is composed of n doped silicon implanted with a phosphor implantation process driven through window 80. The n+ sinker region 100 is typically driven into the substrate material to reach the n+ buried layer 14, as shown in FIG. 4. The use of a deep sinker implantation region reduces collector resistance. The sinker implantation region may be located near one side of an isolation trench 72 which electrically isolates the circuit element being formed. The other side of the trench cross-section is shown at 68.

Figure 5:
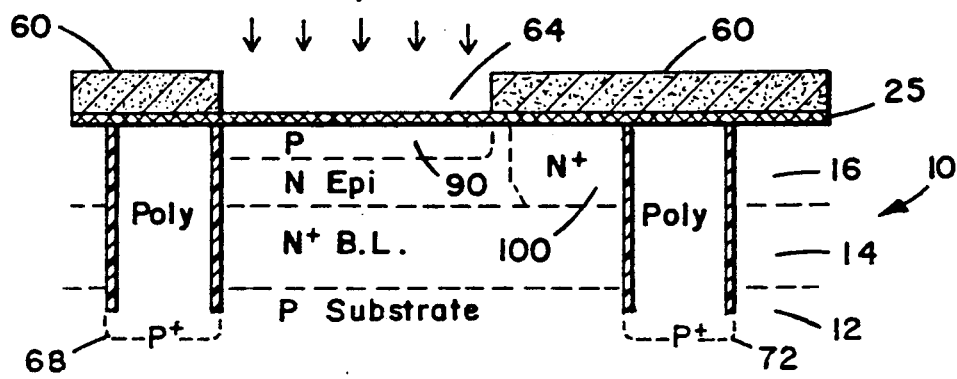

In the preferred process, the sinker region-defining mask then is removed, and a base-defining mask 60 is formed on semiconductor substrate material 10 and oxide layer 25, as shown in FIG. 5. The mask 60 defines a base implantation window 64. Window 64 corresponds to base region 90 formed within the area between isolation regions 68 and 72. The base region does not overlap with sinker region 100. The use of a p+ doped isolation region under the isolation trench allows the use of a p doped substrate which is low-doped. The n doped epitaxial layer may be p doped in the area immediately underneath window 64 through the use, for example, of a boron implant 46 driven through the window into the semiconductor substrate material to form base region 90. For best performance, the base region 90 is relatively thin.

Figure 6:
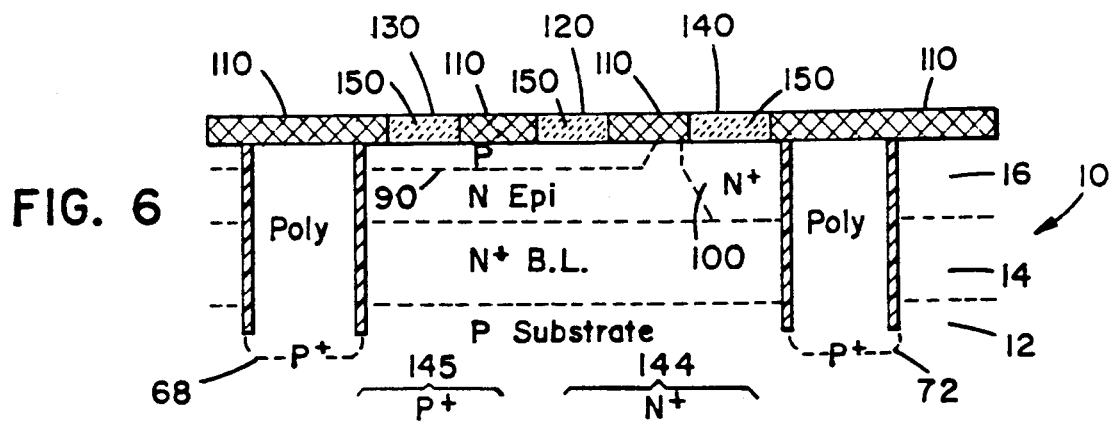
FIGS. 6, 7, and 8 are cross-sectional views of additional process steps in accordance with a preferred implementation of the present invention relating to emitter, collector and base window definition.

A self-aligned emitter, collector and base window feature in accordance with the present invention is shown in the Figures beginning with FIG. 6. The base-region-defining mask 76 is no longer shown, having been removed from the top of the semiconductor substrate material. In the preferred process, a thick, low-temperature oxide layer 110 covering the upper surface of the semiconductor material is then formed. The typical thickness of the oxide layer is 4000-5000 Angstroms.

Through use of masking and etching techniques, emitter, collector and base windows (120, 130 and 140, respectively) are formed in the oxide layer 110. These windows are subsequently refilled with a polysilicon material 150. To maintain a planarized upper surface on the semiconductor substrate material, the polysilicon regions formed in the windows 120, 130 and 140 may be grown by selective epitaxial polysilicon growth, as previously described. Immediately prior to selective epitaxial growth, in-situ cleaning of the windows (for example, by $H_2$ or HCl gas) may be used to remove the native oxide on the surface of the windows 120, 130, 140. This cleaning further reduces contact resistance. The semiconductor substrate having the polysilicon-filled emitter, collector and base windows is shown in FIG. 6.

Figure 7:
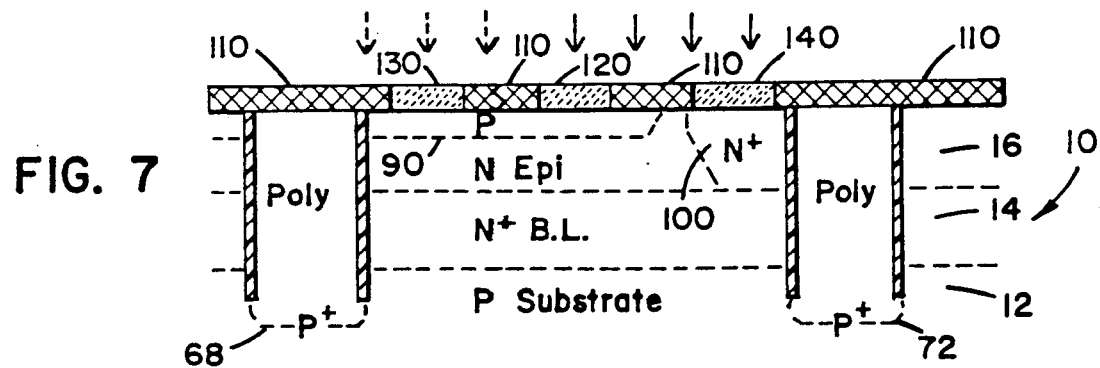

With the emitter, collector and base windows fixedly defined as shown in FIG. 6, implantation of each of these regions is aligned without the need for precise mask alignment. As shown in FIG. 7, implantation of n+ regions into emitter window 120 and collector window 140 is achieved merely by masking base window 130. Precise alignment over the emitter and collector windows is not necessary for n+ implantation 144 to take place. Similarly, the p+ implantation 145 into base window 130 may be accomplished in an aligned manner by covering emitter and collector windows 120 and 140 during the p+ implantation process. As will be readily understood by one skilled in the art, the polysilicon-filled implantation windows are readily adaptable for implantations needed in fabricating other circuit elements.

There are a number of ways that the doped emitter, base, and/or collector regions may be diffused into the substrate. For example, chemical diffusion is a possible alternative. However, for the preferred embodiment described herein ion implantation is used to implant each region, followed by annealing to drive in the implantation regions. Temperatures and times of annealing may vary. However, it is typically desired to have relatively shallow drive-in regions, requiring higher temperature annealing for shorter times. Typically, temperatures in the range of 900°-950° F. and times in the range of 10-30 minutes are used. This process results in diffusing the polysilicon into the substrate, also called driving-in the doped regions.

Figure 8:
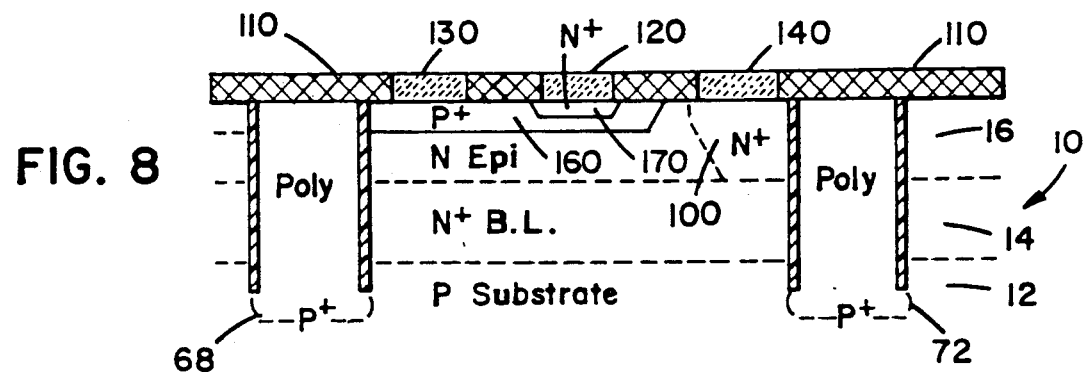

As shown in FIG. 8, the p+ and n+ implantation steps of FIG. 7 further define the extrinsic base 160 and defines emitter region 170. The use of n+ doped polysilicon results in a shallow emitter region 170 which improves the speed performance of the circuit. Alternatively, emitter region 170 may be implanted prior to the definition of base, emitter, and collector windows (130, 120, and 140, respectively, in FIG. 6). However, the resulting additional steps may be avoided when the emitter region is defined as shown in FIGS. 7 and 8. The circuit is shown in FIG. 8 after the drive-in process.

Figure 9:
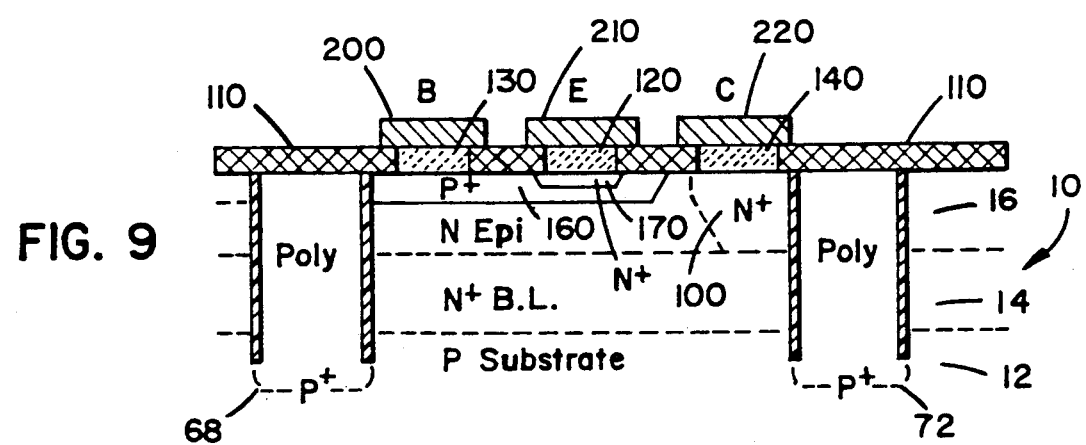
FIG. 9 is a cross-sectional view of the semiconductor substrate structure in accordance with a preferred implementation of the present invention after completion of the process described herein.

Following the drive-in process, a blanket thin oxide etch typically is used on the upper surface of the semiconductor substrate so that contact windows 120, 130 and 140 are open for electrical connection to metal contacts. FIG. 9 shows the base, emitter and collector metal contacts 200, 210 and 220, respectively, completing the electrical contact through base, emitter and collector windows 130, 120 and 140, respectively.

As will be readily seen by one skilled in the art upon review of the above description, only one, or more than one of the emitter, collector and base windows may be opened for implantation and drive-in. This process not only reduces the number of steps needed to implant and drive-in materials at the base, emitter and collector windows, but also reduces the need for precise tolerances in using each window. The greater tolerance which is built into the method allows for improved density and yield.

It will also be clear to one of ordinary skill in the art that the steps of masking which are used throughout the above description may employ either a positive or a negative resist. Moreover, some steps, such as the plasma etch of the surface of the semiconductor material prior to metalization, may be performed without the use of a mask within the spirit of the present invention. The use of a mask as described above is by way of example only.

The use of a doped polysilicon emitter formed by epitaxial growth reduces sidewall capacitances and contact resistance, and improves injection efficiency. The base may be relatively highly doped to reduce base resistance, thus improving speed. Any possible gain losses are largely offset by the improved injector efficiency. Other variations and advantages of the described process will be clear to those skilled in the art.

We claim:

1. A method of making a bipolar integrated circuit structure comprising the steps of:
   (a) forming three implantation openings in a layer of insulating material on the upper surface of a semiconductor substrate;
   (b) selectively forming a polysilicon layer in each implantation opening formed in the insulating material layer by selective epitaxial growth;
   (c) implanting into each polysilicon-filled opening a doping material capable of diffusing into the substrate material below each said polysilicon-filled opening; and
   (d) etching the upper surface of each polysilicon-filled opening formed in the insulating material layer such that the upper surface of the semiconductor structure is substantially planarized.

2. A method as in claim 1 further comprising the step of diffusing doping material from the implanted, polysilicon-filled opening into the semiconductor substrate.

3. A method as in claim 2 wherein the step of diffusion comprises elevating the integrated circuit structure to a selected temperature for a selected period of time.

4. The method of claim 1 further comprising the step of forming an electrical contact conductively coupled to each polysilicon-filled opening defined in the insulating material layer.

5. A method as in claim 1 wherein the step of implanting a doping material comprises the steps of (1) defining an n implantation window for implantation of at least one of the polysilicon-filled openings with n doped material; and (2) defining a p implantation window for implantation of at least one of the polysilicon-filled openings with p doped material.

6. A method as in claim 8 wherein the defined n doped window results in an emitter or a collector being diffused into the substrate, and the defined p doped region results in a base being diffused into the substrate.

7. A method as in claim 1 further comprising the step of in-situ cleaning the implantation opening formed in the layer of insulating material prior to forming a polysilicon layer in the implantation opening.

8. A method of forming a bipolar integrated circuit structure in a semiconductor substrate, comprising the steps of:
   (a) accessing a semiconductor substrate having a doped substrate layer, a doped buried layer, and a doped epitaxial layer;
   (b) forming a first layer of insulating material on the upper surface of the semiconductor substrate;
   (c) forming a second layer of masking material on the first insulating layer, the second layer having at least one implantation opening;
   (d) implanting a first doping material through at least one implantation opening formed in the second layer;
   (e) removing the second layer from the substrate;
   (f) forming a third layer of masking material on the first insulating layer, the third layer having at least one implantation opening;
   (g) implanting a second doping material through at least one opening formed in the third layer;
   (h) removing the third layer from the substrate;
   (i) forming a fourth layer of insulating material on the upper surface of the substrate, the fourth layer having at least three implantation openings;
   (j) filling each implantation opening in the fourth insulating material layer with a polysilicon material such that the top surface of each polysilicon-filled opening is substantially planar with the top surface of the insulating material layer;
   (k) masking at least one of the implantation openings formed in the fourth layer with a fifth masking layer;
   (l) implanting into the polysilicon material filling at least one of the implantation openings in the fourth layer and not masked with the fifth masking layer with a third doping material;
   (m) masking at least one of the implantation openings formed in the fourth layer and implanted with the third doping material with a sixth masking layer;

(n) implanting into the polysilicon material filling at least one of the implantation openings formed in the fourth layer and not masked by the sixth masking layer with a fourth doping material; and (o) diffusing doping material from the polysilicon material into the semiconductor substrate.

9. A method as in claim 8 further comprising the step of electrically isolating the integrated circuit structure by forming at least one layer of dielectric material which extends from the upper surface of the semiconductor to the doped substrate layer, the upper surface of the dielectric material layer being substantially planar to the upper surface of the semiconductor substrate.

10. A method as in claim 8 wherein the step of diffusing comprises elevating the integrated circuit structure to a selected temperature for a selected period of time.

11. A method as in claim 8 further comprising the step of forming an electrical contact conductively coupled to each filled opening in the third insulating layer.

12. A method as in claim 8 further comprising the step of dielectrically isolating an integrated circuit component by:

(a) forming a trench around the region to be isolated in the semiconductor substrate substantially vertically from the upper surface of the semiconductor substrate to the doped substrate layer;

(b) depositing a polysilicon material in the trench formed in the semiconductor substrate by selective epitaxial growth; and (c) etching the upper surface of the semiconductor substrate and the polysilicon-filled trench to form a substantially planar upper surface.

13. A method as in claim 10 wherein the step of forming a trench in the semiconductor substrate comprises the steps of:

(a) applying a masking layer to the upper surface of the semiconductor substrate with a suitable pattern for forming the trench;

(b) applying an etching material through the window formed in the masking material to cut a groove through the semiconductor substrate from the upper surface to the doped substrate layer;

(c) oxidizing the sidewalls of the trench formed in the semiconductor substrate;

(d) implanting a doped channel stop region in the portion of the doped substrate layer immediately below the bottom of the trench cut in the semiconductor substrate; and (e) filling the trench formed in the semiconductor substrate with a polysilicon layer grown through selective epitaxial growth.

14. A method for forming a planar, self-aligned bipolar integrated circuit comprising the steps of:

(a) obtaining a semiconductor substrate having a buried n+ layer and an n doped epitaxial layer;

(b) forming an oxide layer on the upper surface of the semiconductor substrate, the oxide layer having at least three windows defining selective doping regions;

(c) selectively depositing polysilicon into the windows formed in the oxide layer;

(d) masking at least one but less than all of the polysilicon-filled windows;

(e) implanting a doping material into the polysilicon-filled windows which are not masked;

(f) unmasking the masked polysilicon-filled windows of the semiconductor substrate; and (g) diffusing the doping material from the doped polysilicon-filled windows into the semiconductor substrate.

15. A method as in claim 14 further comprising the step of electrically isolating a region of the substrate by:

(a) forming a trench in the semiconductor substrate which extends downward from the upper surface of the semiconductor substrate; and (b) filling the trench with a dielectric material.

16. A method as in claim 14 wherein the polysilicon-filled windows correspond to one or more of the base, emitter, and collector regions.

17. A method as in claim 14 further comprising the step of forming an electrical contact conductively connected to each of the polysilicon-filled windows.

* * * * *

UNITED STATES PATENT AND TRADEMARK OFFICE
CERTIFICATE OF CORRECTION

PATENT NO. : 5,008,208
DATED : April 16, 1991
INVENTOR(S) : Michael S. Liu; Huang-Joung Chen It is certified that error appears in the above-identified patent and that said Letters Patent is hereby corrected as shown below:

Claim 6, Column 6, Line 21, delete "8" and insert --5--.

Claim 13, Column 7, Line 35, delete "10" and insert --12--.

Signed and Sealed this

Eighth Day of September, 1992

Attest:

DOUGLAS B. COMER

*Attesting Officer*    *Acting Commissioner of Patents and Trademarks*